US008532230B2

(12) United States Patent
Taft

(10) Patent No.: US 8,532,230 B2
(45) Date of Patent: Sep. 10, 2013

(54) INSTANTANEOUS PHASOR DETERMINATION FOR POLY-PHASE ELECTRICAL GRIDS

(75) Inventor: Jeffrey D. Taft, Washington, PA (US)

(73) Assignee: Cisco Technology, Inc., San Jose, CA (US)

( * ) Notice: Subject to any disclaimer, the term of this patent is extended or adjusted under 35 U.S.C. 154(b) by 194 days.

(21) Appl. No.: 13/222,142

(22) Filed: Aug. 31, 2011

(65) Prior Publication Data

US 2013/0051498 A1     Feb. 28, 2013

(51) Int. Cl.
*H04L 27/06* (2006.01)
(52) U.S. Cl.
USPC .............................. 375/340; 329/315; 702/70
(58) Field of Classification Search
USPC ...... 329/315, 323, 327; 375/340; 702/70–72
See application file for complete search history.

(56) References Cited

U.S. PATENT DOCUMENTS

| 6,621,617 | B1 | 9/2003 | Poggiolini |
| 7,161,896 | B1 | 1/2007 | Hart et al. |
| 7,349,386 | B1 | 3/2008 | Gou |
| 7,773,499 | B2 | 8/2010 | Hart et al. |
| 2008/0207270 | A1 | 8/2008 | Na et al. |
| 2009/0105979 | A1* | 4/2009 | Escobar Valderrama et al. ............. 702/72 |
| 2010/0213925 | A1* | 8/2010 | Teodorescu et al. ....... 324/76.78 |

FOREIGN PATENT DOCUMENTS

WO    WO-2008055499 A2    5/2008

OTHER PUBLICATIONS

Cataliotti, et al., "A Time-Domain Strategy for the Measurement of IEEE Standard 1459-2000 Power Quantities in Nonsinusoidal Three-Phase and Single-Phase Systems", IEEE Transactions on Power Delivery, vol. 23, No. 4, Oct. 2008, pp. 2113-2123, Institute of Electrical and Electronics Engineers, New York, New York.
Emanuel, et al., "Clarke's Alpha, Beta, and Zero Components: A Possible Approach for the Conceptual Design of Instrumentation Compatible with IEEE Std. 1459-2000", IEEE Transactions on Instrumentation and Measuement, vol. 55, No. 6, Dec. 2006, pp. 2088-2095, Institute of Electrical and Electronics Engineers, Piscataway, New Jersey.
Schulze, et al., "Notification of Transmittal of the International Search Report and the Written Opinion or the International Searching Authority, or the Declaration", Patent Cooperation Treaty, Dec. 3, 2012, 13 pages, PCT/US2012/053007, European Patent Office, Rijswijk, Netherlands.

* cited by examiner

*Primary Examiner* — Curtis Odom
(74) *Attorney, Agent, or Firm* — Edwards Wildman Palmer LLP; James M. Behmke; Stephen D. LeBarron

(57) ABSTRACT

In one embodiment, three substantially simultaneous phase waveforms may be converted into a first quadrature signal and a zero sequence signal. For each phase waveform, a power system digital frequency may be determined through analysis of the first quadrature signal (e.g., and at least one additional prior quadrature signal) while eliminating waveform phase angles from the analysis. Subsequently, demodulation of the first quadrature signal and zero sequence signal based on the power system digital frequency results in a positive sequence phasor, a negative sequence phasor, and a zero sequence phasor.

25 Claims, 11 Drawing Sheets

COMPLEX NOTCH FILTER APPROACH

INSTANTANEOUS PHASOR DETERMINATION FOR POLY-PHASE ELECTRICAL GRIDS

TECHNICAL FIELD

The present disclosure relates generally to electrical grids, and, more particularly, to determining phasors in electrical grids.

BACKGROUND

Electric utilities use alternating-current (AC) power systems extensively in generation, transmission, and distribution. Most of the systems and devices involved operate on three-phase power, where voltages and currents are grouped in threes, with the waveforms staggered evenly. The basic mathematical object that describes an AC power system waveform (current of voltage) is the "phasor" (phase angle vector).

Devices known as Phasor Measurement Units (PMUs) have been commercialized by several companies to calculate phasors from power waveforms. Because phase angle is a relative quantity, it is necessary when combining phasors taken from different parts of a power grid to align the phase angle elements to a common phase reference; this is done in PMUs through the use of GPS timing signals. Such phasors are known as synchrophasors. PMUs measure synchrophasors, but existing devices use phasor calculation methods that have a number of shortcomings. For example, in addition to being generally expensive and burdensome to embedded processors (and thus mostly deployed in transmission grids rather than distribution grids), PMUs generally only calculate the positive sequence, even for unbalanced phasors, but all three sequences are needed for many applications. Furthermore, PMUs use batch-type calculations to produce phasor values, and are thus inadequate to provide phasors on a sub-cycle basis, such as for various protection applications. Moreover, today's synchrophasor calculation methods generally introduce various errors, such as phase lag and group delay, and do not account for variance in actual power system frequency.

BRIEF DESCRIPTION OF THE DRAWINGS

The embodiments herein may be better understood by referring to the following description in conjunction with the accompanying drawings in which like reference numerals indicate identically or functionally similar elements, of which.

DESCRIPTION OF EXAMPLE EMBODIMENTS

Overview

According to one or more embodiments of the disclosure, three substantially simultaneous phase waveforms may be converted into a first quadrature signal and a zero sequence signal (e.g., by a Clarke transformer). For each phase waveform, a power system digital frequency may be determined (e.g., by an instantaneous frequency evaluator) through analysis of the first quadrature signal (e.g., in sequence with at least one additional prior quadrature signal) while eliminating waveform phase angles from the analysis. Subsequently, demodulation (e.g., by a complex frequency-adaptive synchrodyne demodulator) of the first quadrature signal and zero sequence signal based on the power system digital frequency results in a positive sequence phasor, a negative sequence phasor, and a zero sequence phasor.

Description

Figure 1:
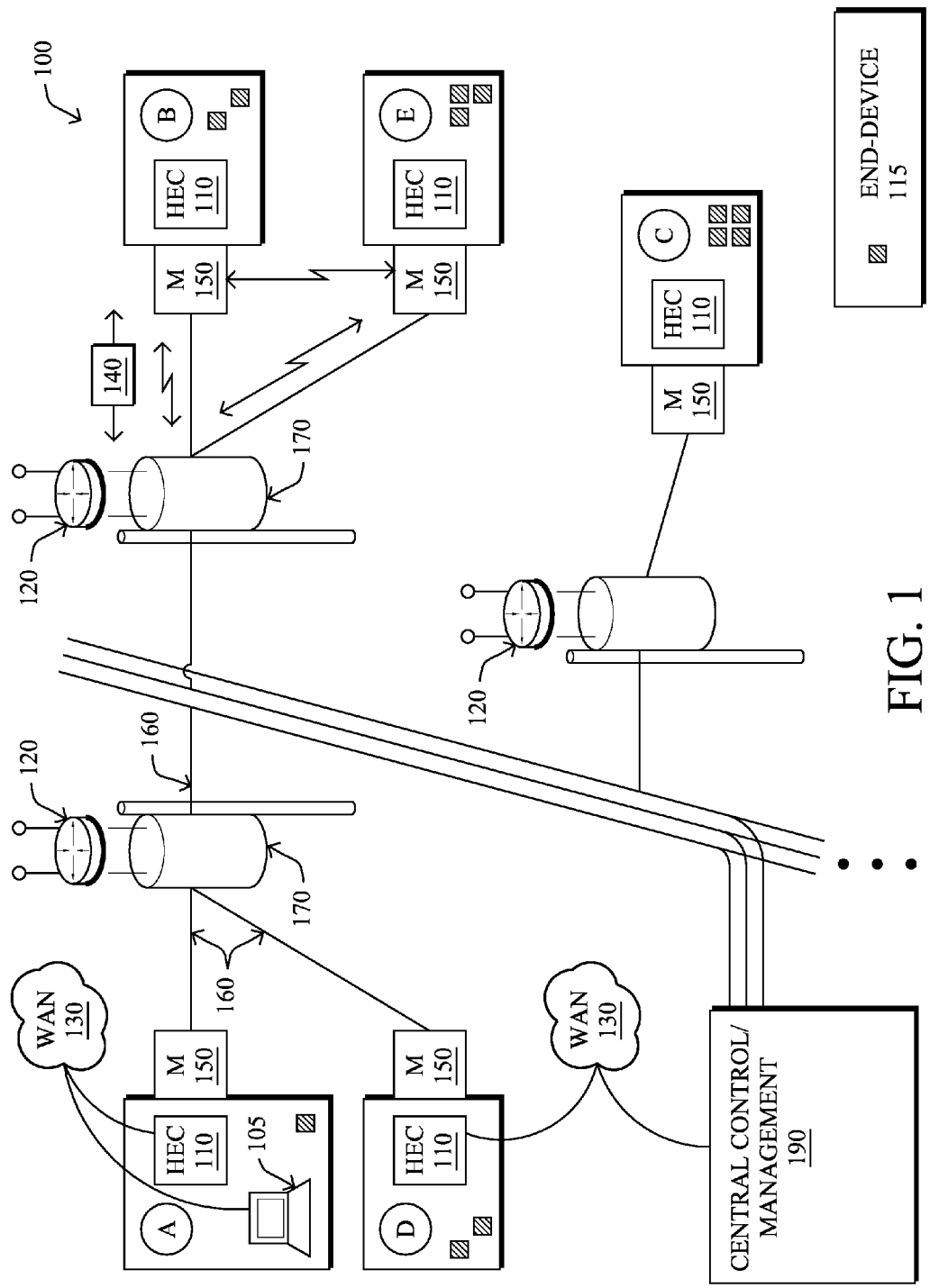
FIG. 1 illustrates an example network of devices shown with various communication and powering configurations.

FIG. 1 is a schematic block diagram of an example simplified network 100 of devices illustratively comprising various communicating and non-communicating devices. For example, power-lines 160 may bring electrical grid power from respective transformers 170 into homes/businesses/etc. to power one or more end-devices 115, generally via a meter 150. In addition, "pole-top" routers 120, such as field area routers (FARs) may communicate data packets 140 (e.g., traffic and/or messages) with other communicating nodes/devices of the network 100. For instance, the links between the devices may be wired links (e.g., for power-line communication "PLC" and/or ethernet) or may comprise a wireless communication medium. An energy controller (e.g., home energy controller, "HEC") 110 or other energy controller may be present at certain locations, and may be in communication with the meters 150, pole-top routers 120, or else directly to another computer network, e.g., WAN 130, similar to conventional computers 105. In addition, a centralized control center or management center 190 may be present in the network 100, such as at an electrical grid company's centralized location, and may be in communication over power-lines 160 and through WAN 130.

Smart object networks, in particular, are a specific type of network having spatially distributed autonomous devices such as sensors, actuators, etc. For example, sensor networks, such as for "Smart Grid" and "Smart Cities" (e.g., for Advanced Metering Infrastructure or "AMI" applications), may cooperatively monitor physical or environmental conditions at different locations, such as, e.g., energy/power consumption, resource consumption, etc. Another type of smart object includes actuators, e.g., responsible for turning on/off an engine or perform any other actions. Generally, smart object networks may include any type of device that is able to communicate information on a computer network, such as household appliances (air conditioners, refrigerators, lights, etc.), industrial devices (heating, ventilating, and air conditioning (HVAC), pumps, motors, etc.), and other "smart" devices. Smart object networks are typically interconnected by a communication network, such as a wireless network, though wired connections are also available, and may often consist of wireless nodes in communication within a field area network (FAN). For instance, each smart device (node) in a smart object network may generally be equipped with a radio transceiver or other communication port, a microcontroller, and an energy source, such as a battery (or, in particular to the embodiments herein, a distribution grid power source). Typically, size and cost constraints on sensor nodes result in corresponding constraints on resources such as energy, memory, computational power and bandwidth.

Notably, though an illustrative embodiment herein relates to smart object networks, the techniques described below may also be used by a single device and/or a non-communicating device, such as a power grid measurement device (e.g., mentioned below). Also, those skilled in the art will understand that any number of nodes, devices, links, etc., as well as any different (and suitable) type of nodes, devices, links, etc., may be present in the network, and that the view shown herein is for simplicity and is not meant to limit the scope of the embodiments herein. In fact, those skilled in the art will appreciate that countless arrangements of power grid components and communicating devices may be established.

As noted above, electric power is generally transmitted from generation plants to end consumers (industries, commercial, residential, etc.) via a transmission and distribution grid consisting of a network of power stations and substations interconnected by transmission circuits/power lines. From the transmission grid, power may then be distributed to end consumers via a distribution system. Once at the end consumers, electricity can be used to power any number of devices, such as end-devices 115.

Figure 2A:
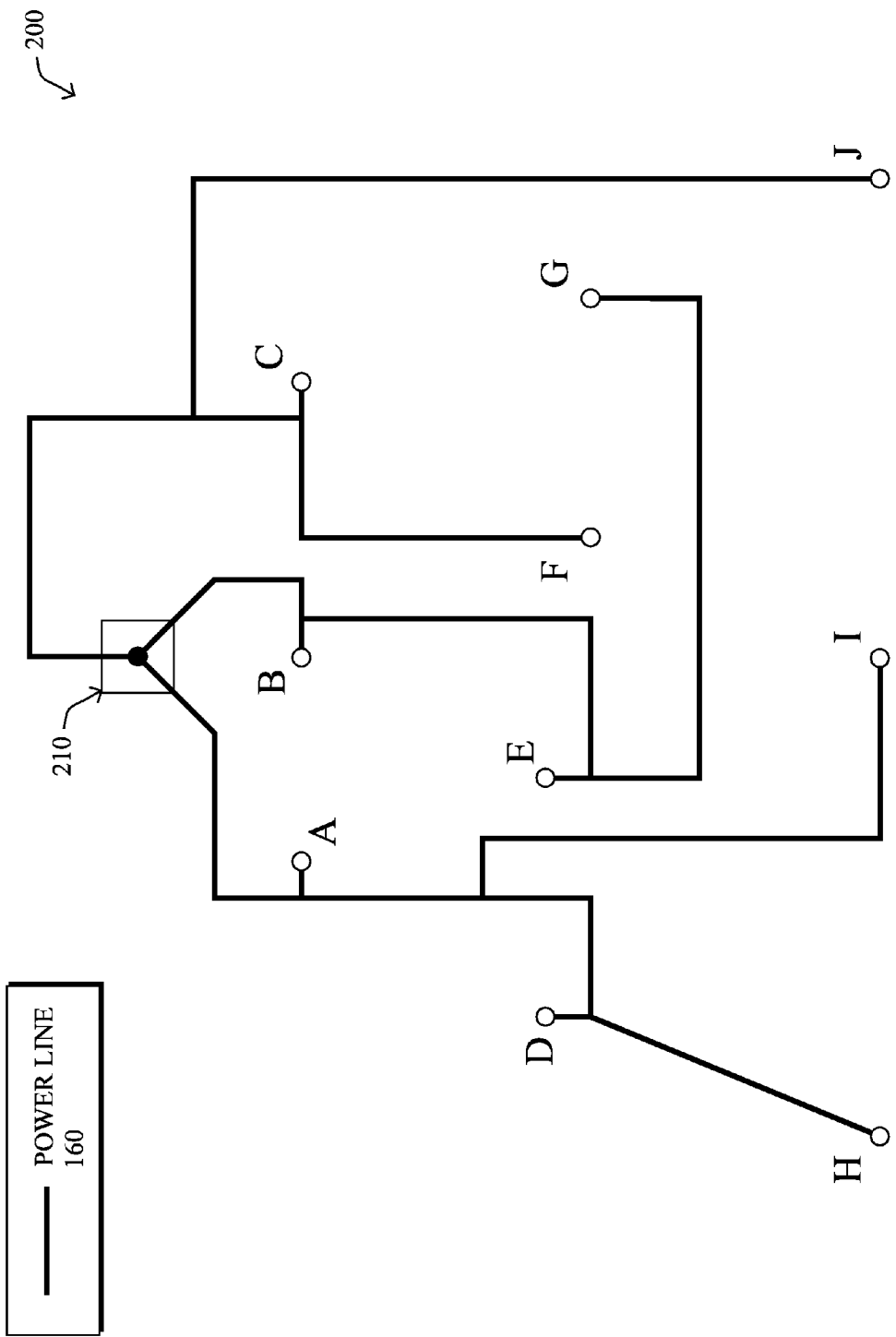
FIG. 2A illustrates an example electric distribution system.

FIG. 2A illustrates a vastly simplified view of an example electric power transmission and distribution grid 200 to the example devices of FIG. 1, above. For instance, a distribution center 210 supplies electricity over a plurality of power lines 160 to the devices at locations "A" through "J".

Figure 2B:
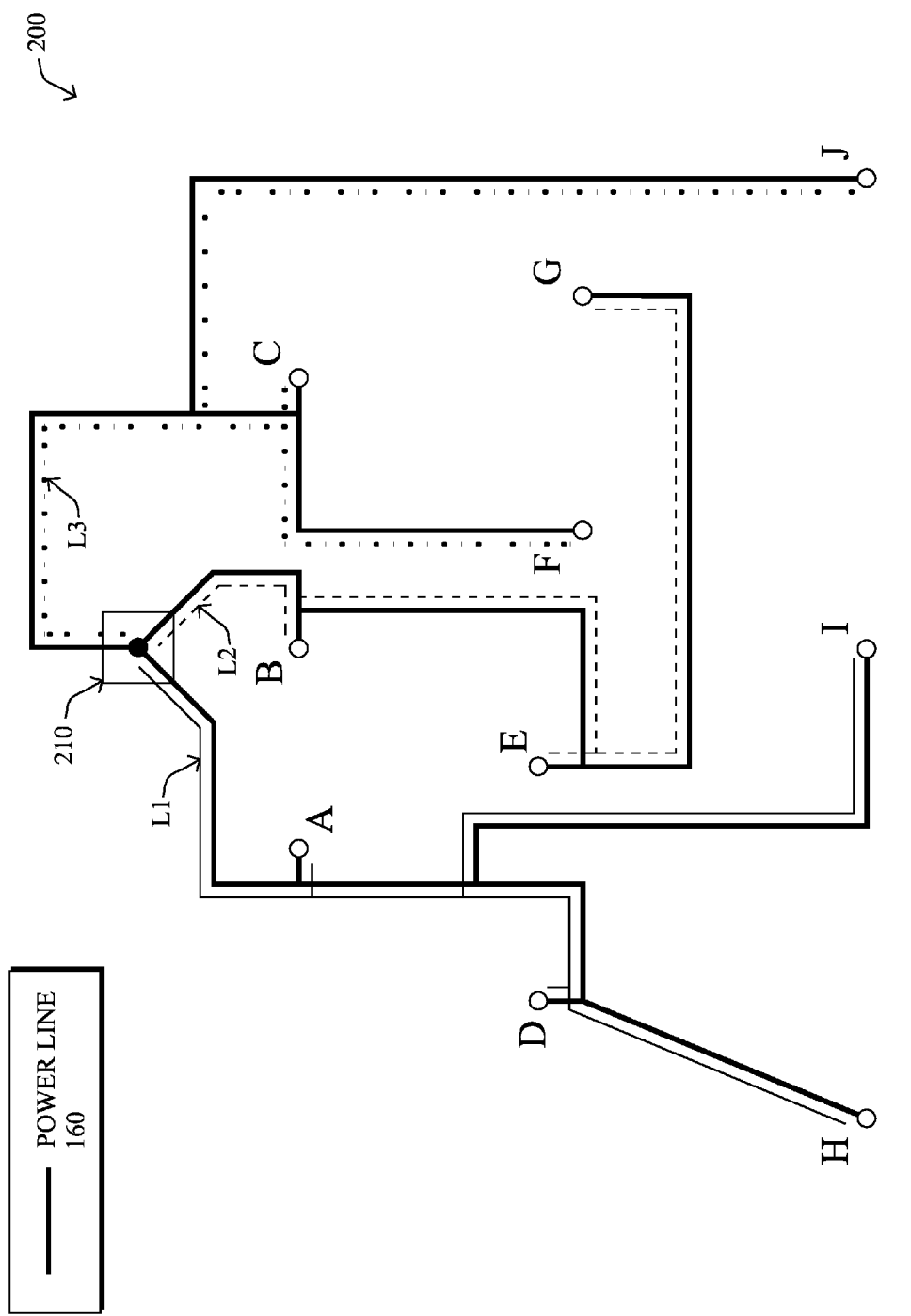
FIG. 2B illustrates an example poly-phase electric distribution if the system shown in FIG. 2A.

The transfer of alternating-current (AC) electric power to the end users most frequently takes the form of poly-phase electric power, where, e.g., three voltage waveforms are produced that are generally equal in magnitude and 120° out of phase to each other. Each phase may generally be used to power entire buildings, neighborhoods, etc., and may also supply power to many (e.g., tens, hundreds, thousands) of devices within those establishments. For smaller customers (e.g., households) usually a single phase is taken to the property. For larger installations (commercial buildings and industrial facilities), all three phases may be taken to a distribution panel, from which both single and multi (two- or three-phase) circuits may be fed. As shown in FIG. 2B, therefore, electrical power of three phases, L1, L2, and L3, is supplied to the locations A-J (a neutral/ground may be shared by the phases).

As further noted above, the basic mathematical object that describes an AC power system waveform (current of voltage) is the "phasor" (phase angle vector). The mathematical basis for phasors was established by Steinmetz in 1893 and has been used in electrical engineering ever since. Phasors represent constant frequency sinusoids as vectors in either polar (magnitude and phase angle) or complex (real and imaginary) form. It is possible and common to perform AC circuit calculations using phasors. In three-phase systems, for instance, phasors necessarily come in threes, and may be balanced (all three phases have equal magnitude and the inter-phasor angles are uniform at 120 degrees each), or unbalanced (not all amplitudes are equal and/or inter-phasor angles are not all 120 degrees).

Figure 3B:
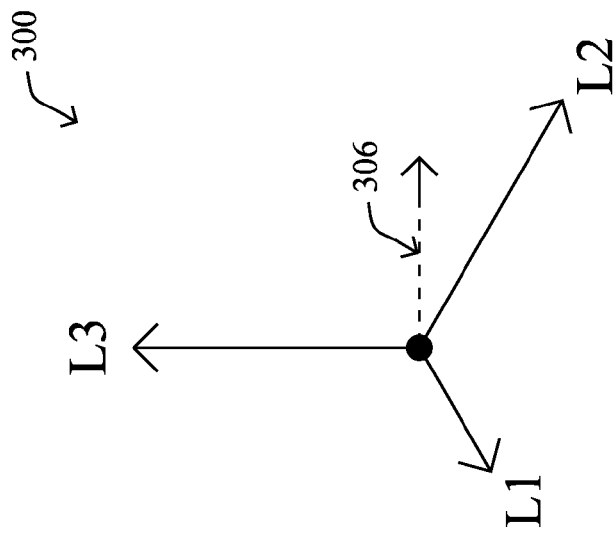
FIGS. 3A-B illustrate example phase representations of the poly-phase electric distribution system.
Figure 3A:
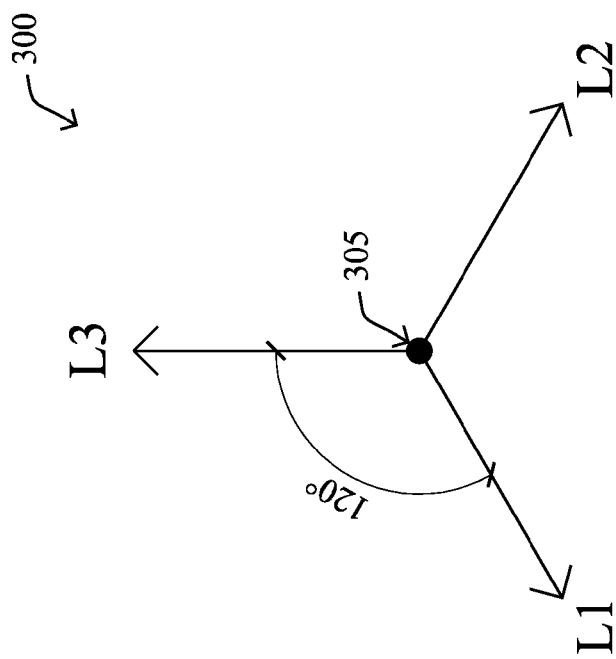

FIG. 3A illustrates an example phase representation 300 of the distribution grid's electrical power. In particular, three waveforms are illustratively produced (L1, L2, and L3) that are generally equal in magnitude and approximately 120° out of phase to each other. The currents returning from the end users to the supply transformer all share the neutral wire (neutral point 305). If the loads are evenly distributed on all three phases, as they are in FIG. 3A, the sum of the returning currents in the neutral wire is zero. Any unbalanced phase loading such as in FIG. 3B, however, may result in a current 306 at the neutral point (e.g., a harmonic distortion in the current), which may cause inefficient use of transformers, or other problems, including (but not limited to) brown-outs or black-outs in extreme cases. (Note that generally, overload of the neutral is a more frequent occurrence, resulting in heating of the neutral, since normally, the substation relay on that circuit should detect negative sequence or zero sequence over-current and trip long before any impact on generators is felt.) There are many factors that may create imbalance between the phases, such as excess load usage, downed power lines, etc.

Notably, it is well known that one can convert unbalanced three-phase phasors into three sets of balanced phasors (a type of superposition). The three balanced phasor sets are known as the positive sequence, the negative sequence, and the zero sequence. This decomposition is often done for a variety of reasons and many power protective devices are designed to use one or more of the sequences to perform their functions. The concept and method of symmetric components was invented by Fortescue in 1918; it became widely accepted in the power engineering field after WWII.

In 1988, devices that calculate phasors from power waveforms were developed by Phadke and Thorp at Virginia Tech and have since been commercialized by several companies. Such devices are known as Phasor Measurement Units (PMUs). Because phase angle is a relative quantity, it is generally necessary when combining phasors taken from different parts of a power grid to align the phase angle elements to a common phase reference; this is typically done in PMUs through the use of GPS timing signals. Such phasors are known as synchrophasors. PMUs measure synchrophasors, but existing devices use phasor calculation methods that have a number of shortcomings. These shortcomings include, among other things:

1. PMUs generally only calculate the positive sequence, even for unbalanced phasors, but all three sequences are needed for many applications.
2. PMUs use batch-type calculations to produce phasor values, and so are somewhat limited by the need to accumulate batches of waveform samples; most PMUs produce 30 or 60 phasors per second in North America (25 or 50 in Europe), whereas the industry wishes to go to 120 phasors per second or more (e.g., 240/second and even 7200/second). The more advanced protection schemes are sub-cycle in nature, which is one instance where the faster phasor sample rate requirements arise.
3. Synchrophasor calculation methods introduce various errors:
    a. Phase lag and group delay due to the use of internal high order filters.
    b. Additional group delay due to the need to buffer a set of waveform samples before the phasor calculation (typically involving a Discrete Fourier Transform).
    c. Synchrophasor correctness depends on the frequency for which the phasors are calculated vs. actual power system frequency but power system frequency changes dynamically due to changing load and generation conditions, so calculated phasors can be in error if system frequency is assumed to be constant and known. Various compensation techniques exist, but they all suffer from inability to use instantaneous frequency, and most methods for determining instantaneous frequency involve either batch calculations, feedback (such as in phase locked loop approaches), iterative calculations (some sinusoid parameter trackers), or poor transient dynamics.

4. Existing PMUs are expensive and are mostly deployed in transmission substations, even though there are significant applications for phasor measurement on distribution grids.

5. The computations necessary to generate synchrophasors from waveform samples are burdensome to embedded processors. Consequently, the deployment of phasor measurement, especially on distribution grids, is limited.

Though the topology of the electric distribution grid typically considers the approximate balancing of the three-phase system, and other stabilization factors of the distribution grid in general, various factors, such as physical events and/or the dynamic nature of energy utilization in general, may result in imbalance and/or destabilization of the grid. At the present time, the uses for synchrophasor measurement include:

1. Real time monitoring and control—early indication of grid problems, instability, inter-area oscillation, voltage instability (e.g., operator decision support).
2. State determination—based on greater measurement and less estimation; boundary state for Regional Transmission Organization (RTO)/Independent System Operator (ISO) applications; WAMS (Wide Area Measurement System, or alternatively, Wide Area Management Services).
3. Regional transmission congestion management—to operate the grid according to true dynamic limits.
4. Post-disturbance analysis—orders of magnitude time savings in diagnosing events; also expedites power restoration.
5. Benchmarking system models, validation, fine-tuning—improved parameter values support better flow models.
6. Power system restoration—reduced risk of unsuccessful reclosings.
7. Protection and Control for distributed generation—precise islanding, microgrid operations, synchronization.
8. Multi-terminal transmission line protection.
9. Directional and distance relaying; fault impedance relaying.
10. Overload monitoring and dynamic rating (real time line impedance).
11. Adaptive protection—improve relay algorithms by making them adjust to real time conditions.
12. Real time automated control—automated prevention of angular and voltage stability problems, reduced low frequency oscillations (modal power oscillation damping); nonlinear flexible AC transmission systems (FACTS) control for grid stability (static VAR compensators or "SVCs," static compensators or "STATCOMs," Dynamic Voltage Restorers or "DVRs," United Power Flow converters or "UPFCs," etc.).
13. System integrity protection schemes—early and accurate determination of when power system is headed into instability.
14. Distribution level stabilization via distribution static compensators (DSTATCOMs).
15. Distribution level pre-fault analysis.
16. Distribution level fault detection/classification/location.
17. Dynamic power grid asset rating and utilization optimization.

Other applications will continue to be developed as PMU data becomes available to system operators and distribution engineers. Note that for protection applications, as mentioned above, it is desirable to act on a sub-cycle basis, so the availability of per-sample period phasors is a key enabler of advanced protection schemes. Though as noted, standard approaches to synchrophasor determination use batch calculations and only produce the positive sequence at rates of 30-60 reports per second.

Instantaneous Phasor Determination

The techniques herein convert three-phase voltage or current signals to all three symmetric components on an instantaneous basis, directly incorporating instantaneous power system frequency. In particular, the techniques herein determine symmetric components and unbalanced synchrophasors from three-phase power line voltage or current signals. In addition, the techniques calculate instantaneous phasors and use instantaneous power system frequency in the demodulation process so that phasors errors do not result from mismatch of assumed frequency and actual power system frequency or power system frequency dynamics. Moreover, as described herein, a simplification is available that can be automatically used when the inputs represent balanced phasors.

Specifically, according to one or more embodiments of the disclosure as described in greater detail below, three substantially simultaneous phase waveforms may be converted into a first quadrature signal and a zero sequence signal (e.g., by a Clarke transformer). For each phase waveform, a power system digital frequency may be determined (e.g., by an instantaneous frequency evaluator) through analysis of the first quadrature signal (e.g., in sequence with at least one additional prior quadrature signal) while eliminating waveform phase angles from the analysis. Subsequently, demodulation (e.g., by a complex frequency-adaptive synchrodyne demodulator) of the first quadrature signal and zero sequence signal based on the power system digital frequency results in a positive sequence phasor, a negative sequence phasor, and a zero sequence phasor.

Figure 4:
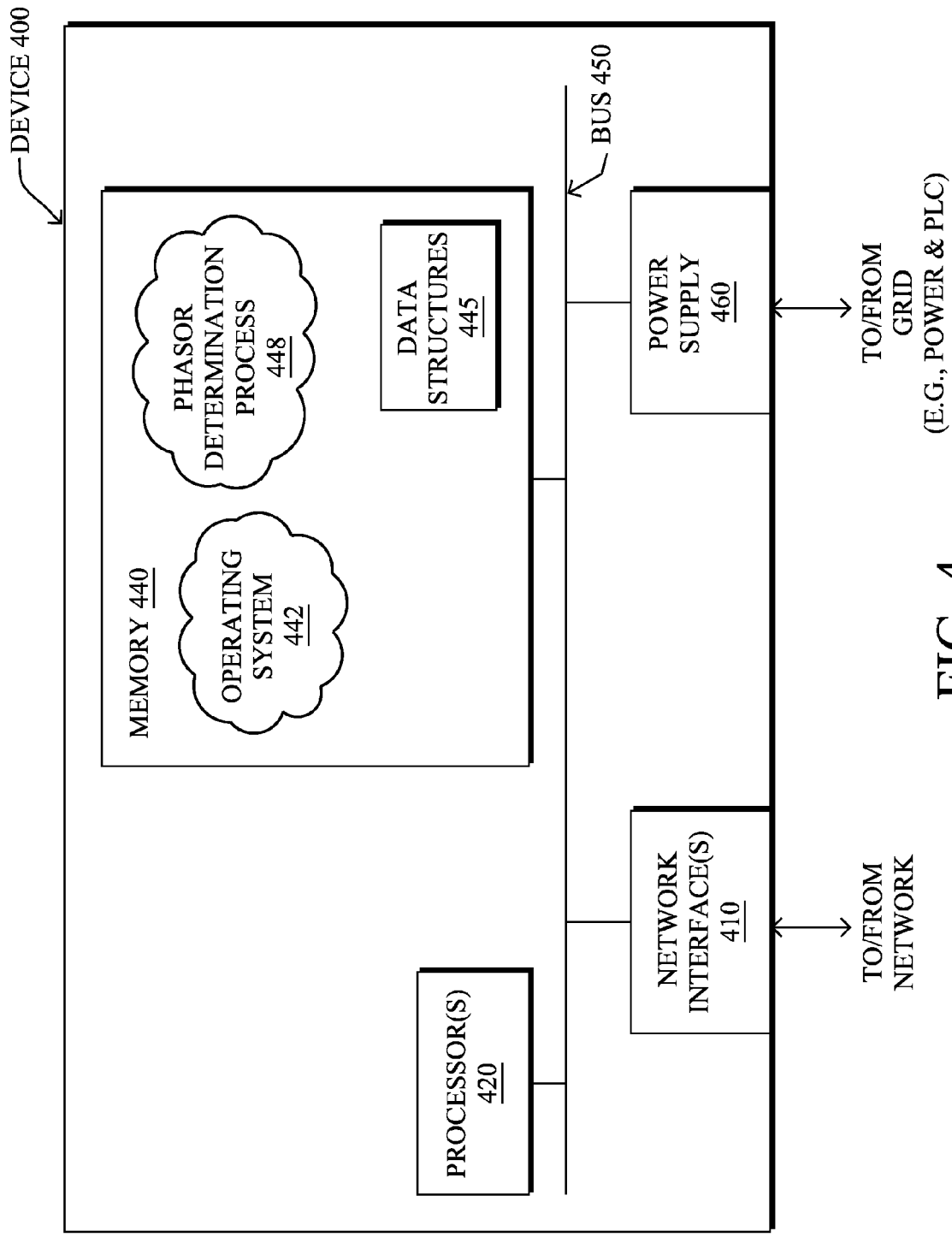
FIG. 4 illustrates an example computation/measurement device.

Illustratively, the techniques described herein may be performed by hardware, software, and/or firmware. FIG. 4 is a schematic block diagram of an example device 400 that may be used with one or more embodiments described herein, e.g., as an appropriately configured measurement/computation device, such as a head-end device (or application) within the central management center 190, a FAR 120, a meter 150, an energy controller 110, a PMU, etc. The device 400 may comprise, as one simple computer-implemented representation, a network interface 410, a processor 420, and a memory 440 interconnected by a system bus 450. Notably, the device may also be powered by a power supply 460 attached to the power grid (power-line 160).

The network interface 410 contains the mechanical, electrical, and signaling circuitry for communicating data over physical and/or wireless links coupled to the network 100. The network interface may be configured to transmit and/or receive data using a variety of different communication protocols, including, inter alia, various wired or wireless protocols, powerline communication (PLC) protocols, broadband over power lines (BPL), etc.

The memory 440 comprises a plurality of storage locations that are addressable by the processor 420 for storing software programs and data structures associated with the embodiments described herein. The processor 420 may comprise necessary elements or logic adapted to execute the software programs and manipulate the data structures 445. An operating system 442, portions of which are typically resident in memory 440 and executed by the processor, functionally organizes the device by, inter alia, invoking operations in support of software processes and/or services executing on the device. These software processes and/or services may comprise an illustrative "phasor determination" process 448, for use as described herein, as well as other processes not shown for clarity.

Phasor determination process 448 may contain computer executable instructions executed by the processor 420 to perform functions relating to the novel techniques described herein. It will be apparent to those skilled in the art that other processor and memory types, including various computer-readable media, may be used to store and execute program instructions pertaining to the techniques described herein. Also, while the description illustrates various processes, it is expressly contemplated that various processes may be embodied as modules configured to operate in accordance with the techniques herein (e.g., according to the functionality of a similar process).

Figure 5:
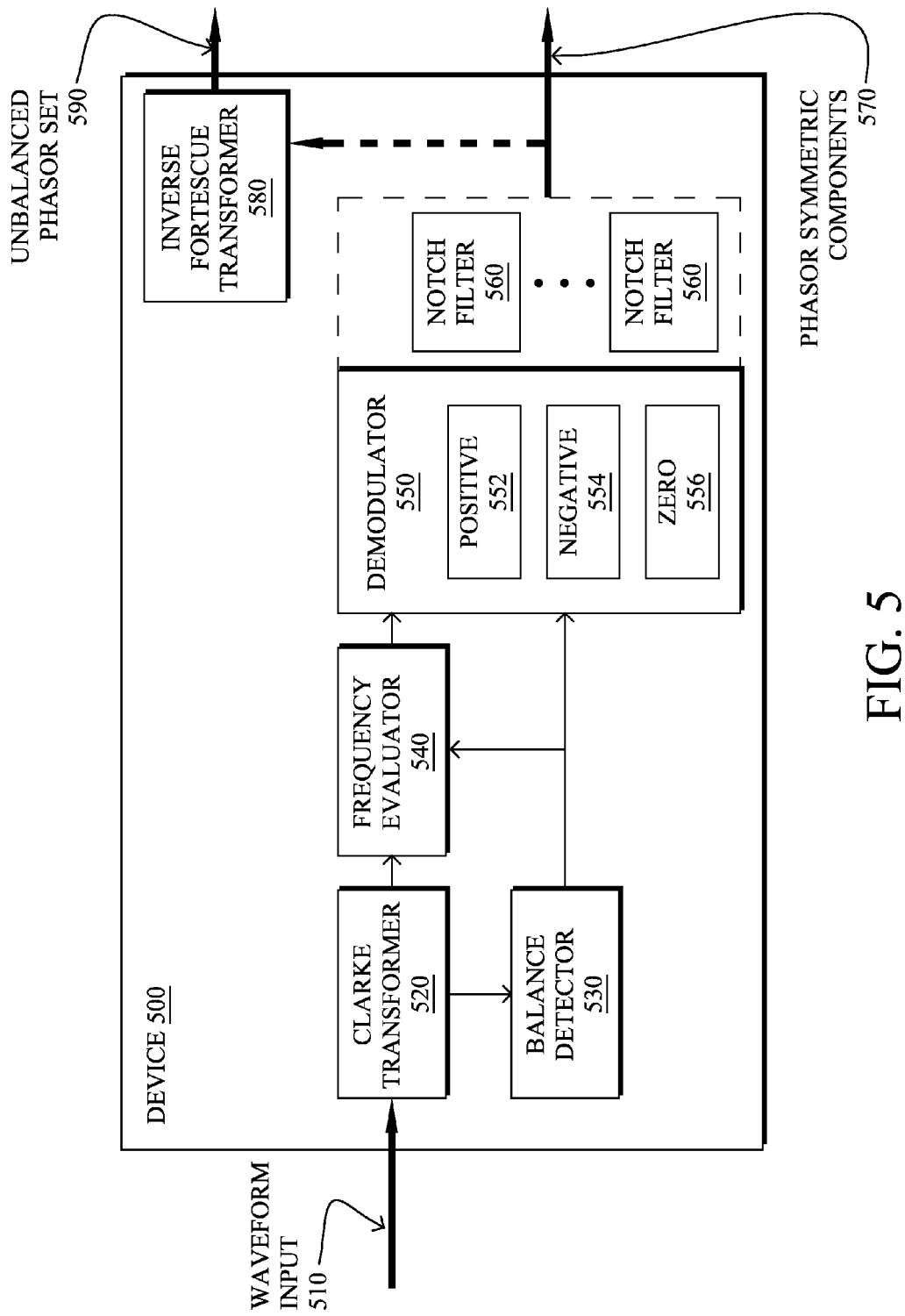
FIG. 5 illustrates an alternative example computation/measurement device.

Moreover, while in certain embodiments the techniques herein may be implemented as a software process (e.g., process 448), additional or alternative embodiments may be implemented as hardware, software, firmware, or a combination thereof. For example, FIG. 5 illustrates a simplified logical/hardware model of a phasor measurement/computing device 500 that may be operated to perform one or more techniques described herein (e.g., a logical representation of software/modules of phasor determination process 248 and/or hardware/firmware components configured to operate accordingly). For example, as described in greater detail below, a waveform input 510 may be supplied to a Clarke transformer 520, which, based on a balance detector 530, may supply a result to a frequency evaluator 540, which then provides input to a demodulator 550. Illustratively, the demodulator may comprise a positive sequence phasor portion 552, negative sequence phasor portion 554, and zero sequence phasor portion 556, as well as a plurality of notch filters 560, each of which being described below, to produce phasors (phasor symmetric components) 570. Optionally, as also mentioned below, the phasors 570 produced as a result of the demodulation may be passed through an inverse Fortescue transformer 580 to produce an unbalanced phasor set 590.

Operationally, the Clarke transformer 520 converts three substantially simultaneous phase waveforms (input 510) into a quadrature signal and a zero sequence signal. The Clarke transform is known in the art to convert three-phase signals into a quadrature signal and a zero sequence signal, and has been used mainly in AC motor control theory. Also, an instantaneous frequency evaluation process (frequency evaluator 540) then analyzes the sequence of Clarke transformer quadrature outputs to determine power system digital frequency on each waveform sample, while eliminating input waveform phase angles from consideration. The analysis, as shown below, is based on a sequence of the quadrature signal from the Clarke transformer and at least one additional prior quadrature signal. Additionally, a complex frequency-adaptive synchrodyne demodulator 550 with three sub-sections (552, 554, and 556) is configured to demodulate, based on the power system digital frequency, the quadrature and zero-sequence signals into positive, negative, and zero sequence phasors 570. Note that the demodulator also includes a set of notch filters 560, e.g., to remove double frequency signal components that arise in the demodulation process (shown below).

Worth noting, is that the synchrodyne was invented around 1932 as an incremental improvement to the homodyne demodulator. The homodyne was developed as a radio communications device, whereas the synchrodyne was developed as a measurement instrument. Both involve a local oscillator operating at the same frequency as the signal carrier. The techniques herein illustratively utilize a complex digital implementation (where complex means using real and imaginary or in-phase and quadrature components).

In accordance with an illustrative embodiment, the techniques also include an optional inverse Fortescue transformer 580 to convert the symmetrical components phasors 570 into an unbalanced phasor set 590 if desired. As mentioned above, Fortescue invented the concept of symmetric components representation of unbalanced phasors. The Fortescue transform (not used herein) converts unbalanced phasors to equivalent symmetric components (positive, negative and zero sequences), while the inverse transform (used herein) converts form symmetric components to the equivalent unbalanced phasors.

Note that elimination of harmonic components of the input signals is well-known, and is thus not discussed herein.

Figure 6:
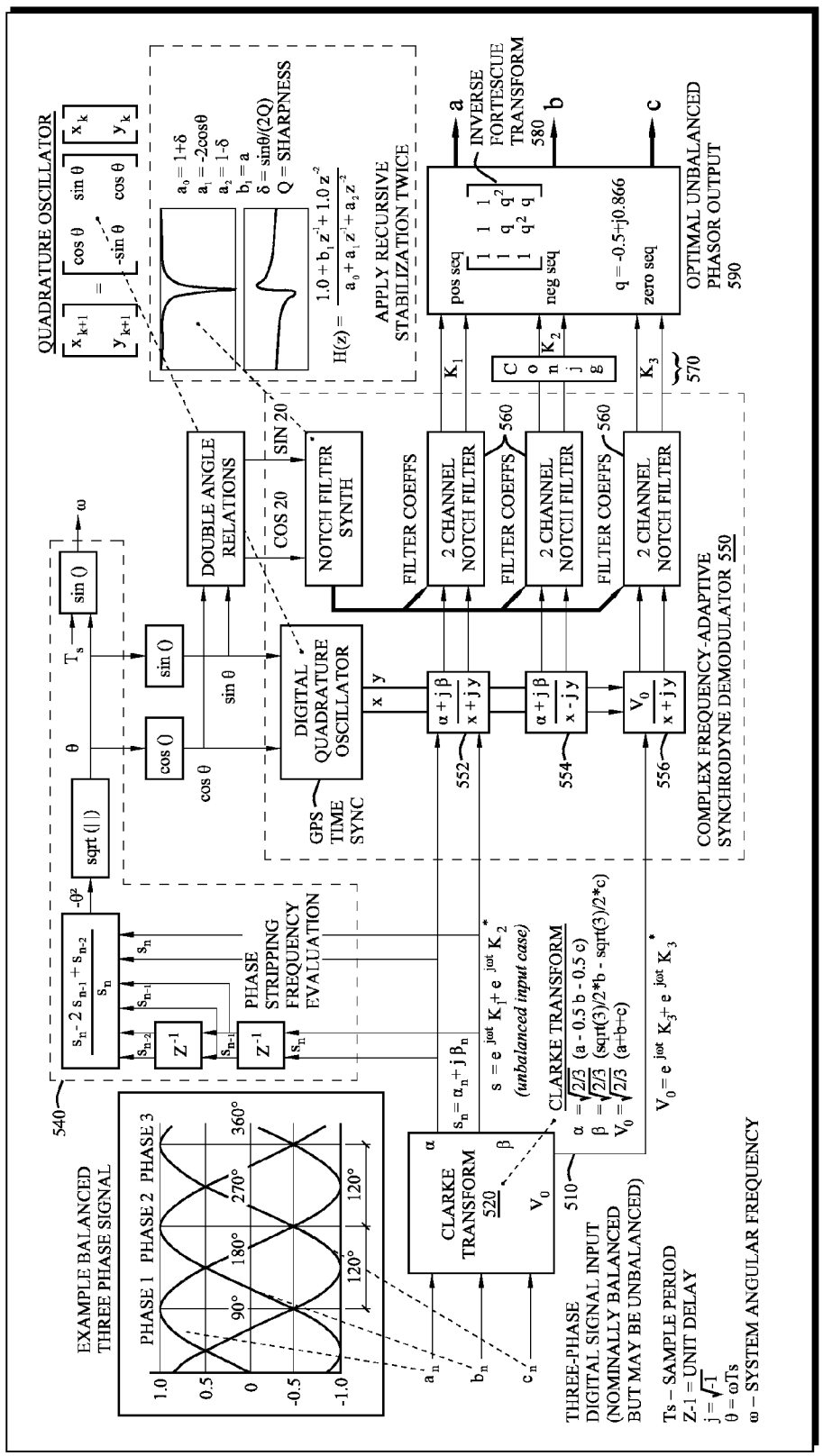
FIG. 6 illustrates an example implementation of phasor determination.

In accordance with one or more embodiments of the techniques herein, a first example implementation is now detailed with reference to FIG. 6. As shown in FIG. 6, each set of three-phase signal samples $a_n$, $b_n$, and $c_n$, (acquired simultaneously, or close enough so no significant skew error is generated) is processed via Clarke transform 520 to generate one quadrature signal ($s=\alpha+j\beta$) and one zero sequence signal ($V_0$). As shown in FIG. 6, the signal s is a sum of two scaled complex exponentials with the form:

$$s = e^{j\omega t}K_1 + e^{-j\omega t}K_2^*$$

where $K_1$ is the positive sequence phasor and $K_2^*$ is the complex conjugate of the negative sequence phasor. Through the frequency evaluator 540, the signal s ($s_n$) and two past quadrature signal values ($s_{n-1}$ and $s_{n-2}$) are used to calculate the negative of the square of the instantaneous digital system frequency $\theta$. The instantaneous digital frequency is converted to real/imaginary form and is used to update the quadrature oscillator of the demodulator 550 by one clock tick. The digital frequency may also be converted to analog system angular frequency $\omega$ as an output for use by other applications. The frequency evaluation takes advantage of the form of the complex signal s. The ratio of second derivative of s to the present value of signal s yields the negative of the square of digital frequency. In practice, the second difference and the present signal value may be used to obtain $\theta$.

The quadrature oscillator may be phase adjusted by pulses from a GPS (global positioning satellite) timing source. In particular, by adding the GPS timing, the techniques herein provide for synchrophasor measurement in addition to merely phasor measurement, i.e., synchronizing the phasors as regards phase angle. (Phase angle is a relative quantity so a common basis is needed, otherwise phasors measured at different points on a distributed circuit may not be combined arithmetically.) GPS is one illustrative example to allow for global referencing, though other references can be used local to the point of measure, i.e., not in combination with any phasors measured by any other unsynchronized measurement means. Notably, the oscillator phase may be reset once per second, or on a more frequent basis, such as once per nominal power cycle or an integer multiple thereof.

The $K_1$ and $K_2^*$ demodulators work by using complex arithmetic to downshift or upshift the signal s, as shown in FIG. 6. The upshift (portion 552) of the quadrature signal moves the negative sequence modulation frequency to zero and doubles the positive sequence frequency. Likewise, the downshift (portion 554) of the quadrature signal sets the positive sequence modulation frequency to zero and doubles the negative sequence frequency. The positive sequence phasor and negative sequence phasor may then be correspondingly obtained through removal of a double frequency component resulting from the upshifting and downshifting, respectively. That is, the two-channel notch filters 560 with illustrative filter configuration as shown in FIG. 6, remove the double frequency components with asymptotically zero group delay and phase lag, leaving the DC or near DC components, which are the complex phasor coefficients desired ($K_1$ and $K_2$). Note that for the negative sequence, it is necessary to perform a complex conjugate to obtain the complex phasor coefficient $K_2$.

The zero sequence demodulation works in generally the same way, except that we need only one demodulation that uses one of either the positive frequency or a negative frequency of the zero sequence signal, since the phasor coefficient $K_3$ is the same on both the positive and negative frequencies:

$$V_0 = e^{j\omega t} K_3 + e^{-j\omega t} K_3^*$$

As mentioned above, the phasor coefficients $K_1$, $K_2$, and $K_3$ may be input to an inverse Fortescue transformer 580 (e.g., with an illustrative value for q) to produce an optional unbalanced phasor output 590.

Note that while the embodiment shown in FIG. 6 uses an illustrative technique to evaluate instantaneous frequency, other methods of determining digital frequency might be used. The method disclosed herein has the advantage of handling dynamic variations of system frequency automatically. It also has the disadvantage, however, of being a differential method, and therefore could be noisy under some conditions. Smoothing of the digital frequency could be employed in these circumstances but is not desirable, as this would introduce dynamic lag into the process.

Also note that the notch filters shown in the unbalanced phasor process of FIG. 6 are illustratively second order recursive, and are designed from standard notch filter prototypes. However, standard prototypes do not provide sufficiently narrow reject bands, and have group delay and phase lag near DC that may be considered too large for the techniques herein. This may be resolved by modifying the prototype through a recursive feedback stabilization process during filter synthesis that provides a new "sharply defined" second order filter with very high Q (sharpness) at the desired doubled frequency, and therefore a narrow reject band and near zero group delay and phase lag at DC. Moreover, to make the filters adaptive to changes in power system frequency, the process can modify the filter coefficients on each waveform sample period. Therefore the filters will track the system frequency variations. While in one embodiment, the filter coefficients may be updated on each sample, an alternative embodiment herein provides that the filter coefficients be updated less often, e.g., depending upon system frequency dynamics. In fact, the filter coefficients may be updated based on automatically determining when system frequency deviates by more than a threshold amount from the last value of system frequency used to update the filter coefficients.

For the case where the input signals represent balanced phasors, that is, determining that the three substantially simultaneous phase waveforms are balanced, the techniques herein may be simplified significantly and automatically. In particular, the zero sequence signal from the Clarke transformer ($V_0$) is exactly zero for a balanced phasor set. By thresholding a rectified version of $V_0$ with a small amount of optional low order smoothing (first or second order recursive), the system can detect the balanced case and switch to a simplified technique (set of steps) as illustrated in FIG. 7.

Figure 7:
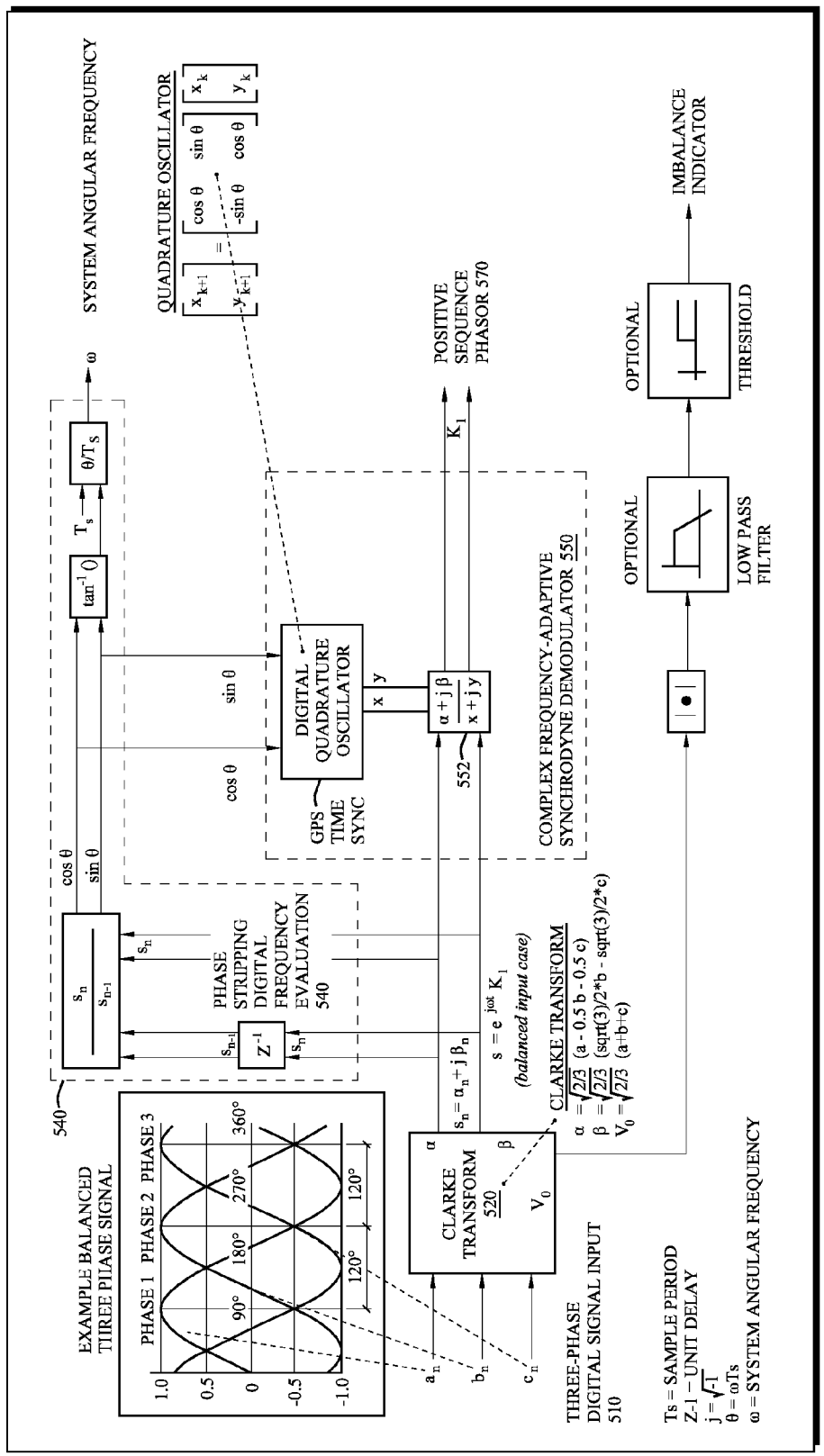
FIG. 7 illustrates another example implementation of phasor determination, particularly for balanced waveforms.

In the simplified process shown in FIG. 7, frequency evaluation may be based on only present and one prior value for signal s, which is possible due to the simplified form of s. In this instance, the demodulator 550, in response to determining that the three substantially simultaneous phase waveforms are balanced (imbalance indicator), need only determine the positive sequence phasor $K_1$ (the negative and zero sequence phasors are exactly zero). No notch filters are required here in FIG. 7 because no frequency doubling occurs in the demodulation step in the balanced case. Note that FIG. 7 also illustrates an example technique for determining whether the phasors are balanced or not by processing the $V_0$ output of the Clarke transformer (i.e., based on the zero sequence signal). In practice, this step would be taken before performing any of the frequency evaluation or demodulation steps.

In accordance with one or more additional or alternative embodiments herein, the solution of FIG. 6 (and FIG. 7 in the balanced case) can be improved in the following way: the six notch filters (three 2-channel filters) can be replaced with two notch filters that have complex coefficients plus one complex subtraction (subtractor). This additional version of the technique is detailed in FIG. 8, and has the advantage of having fewer filters and thus less opportunity for phase distortion. In particular, this model may be implemented in software or logic (e.g., an ASIC), and is thus not limited to real coefficients. That is, since the positive and negative sequence phasors are differentiated by their complex components, real filters (as in FIG. 6) are unable to make that differentiation when notching out particular frequencies. By using complex notching, however, the negative frequency may be removed from the positive sequence phasor $K_1$. To then obtain the negative sequence phasor $K_2$, half of the signal s ($s_a$) may be subtracted from s (by the subtractor 858) to extract the other half of the signal ($s_b$) for input to the downshifting portion 554.

Figure 8:
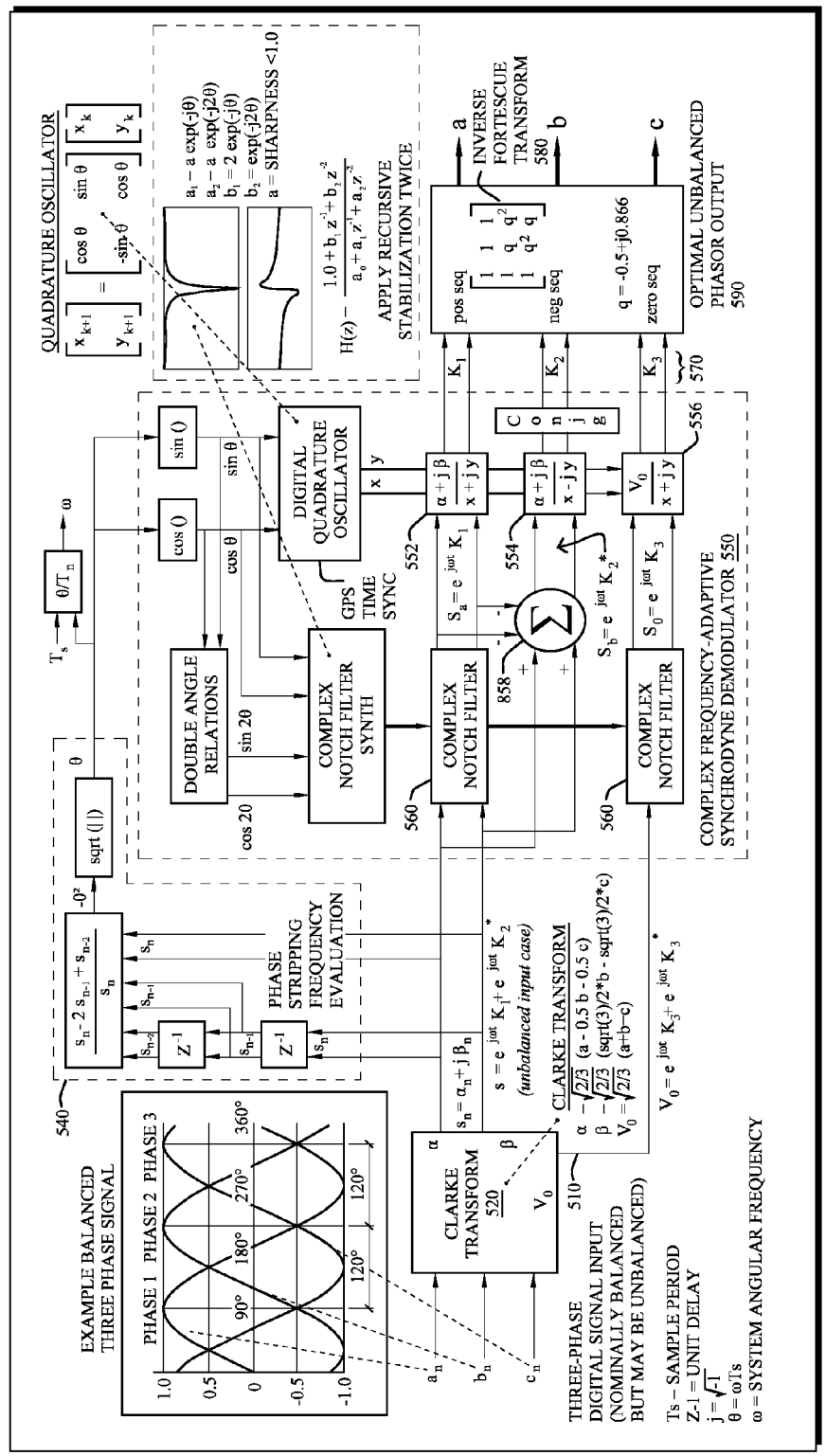
FIG. 8 illustrates another example implementation of phasor determination, particularly where complex coefficient notch filters are available.

Said differently, FIG. 8 illustrates an alternative embodiment where a first complex coefficient notch filter (560) is utilized/implemented between an output of the Clarke transformer and an input of the demodulator for the positive sequence phasor (552), and a second complex coefficient notch filter (560) is used between the output of the Clarke transformer and an input of the demodulator for the zero sequence phasor (556). The complex subtractor 858 may then be utilized/implemented between the output of the Clarke transformer and an input of the demodulator for the negative sequence phasor to subtract an output of the first complex coefficient notch filter ($s_a$) from the output of the transformer (s) for the input ($s_b$) of the demodulator for the negative sequence phasor (554). The remainder of the operation is similar to that shown and described for FIG. 6 above.

Figure 9A:
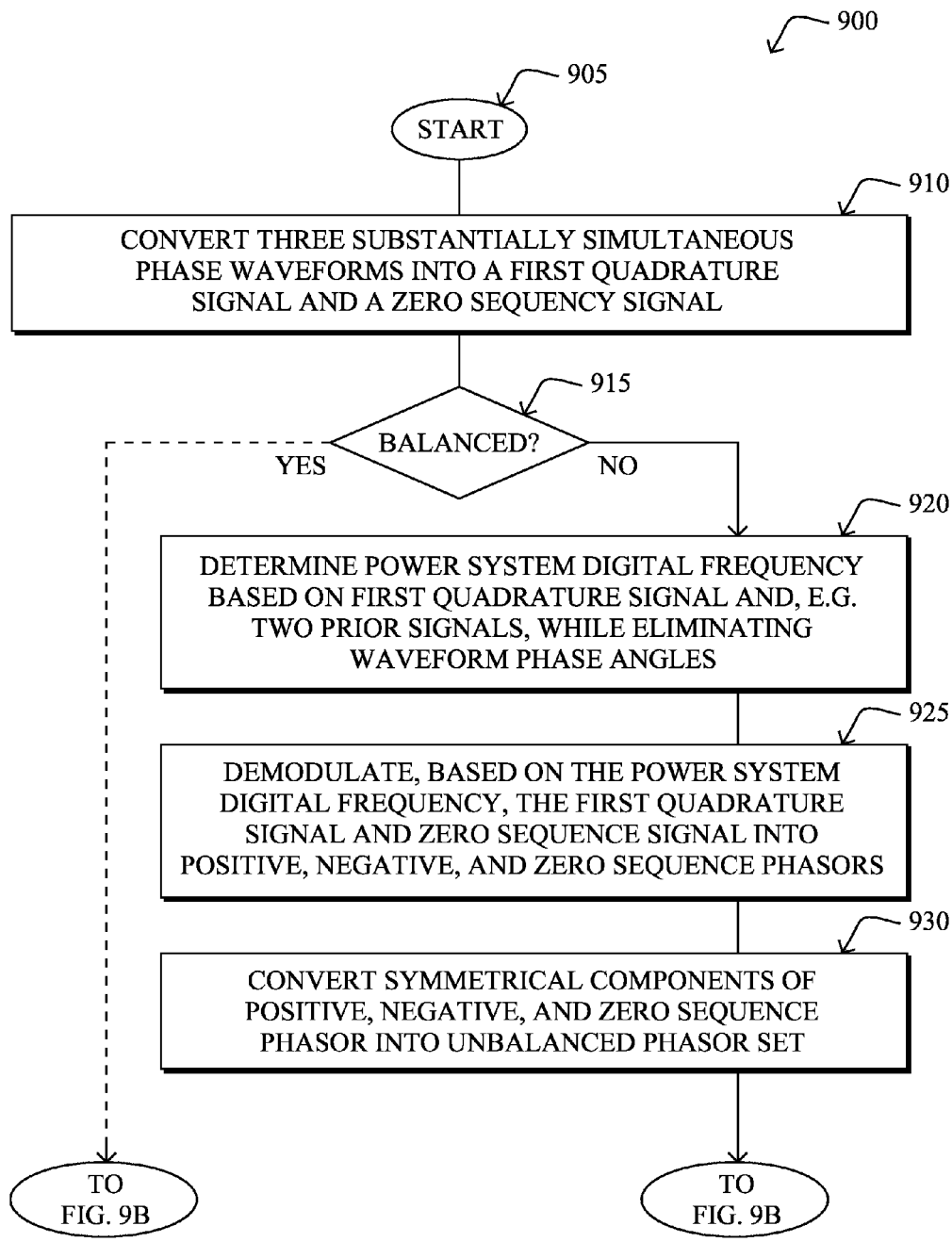
FIGS. 9A-9B illustrate an example simplified procedure for instantaneous phasor determination in a poly-phase electric system.
Figure 9B:
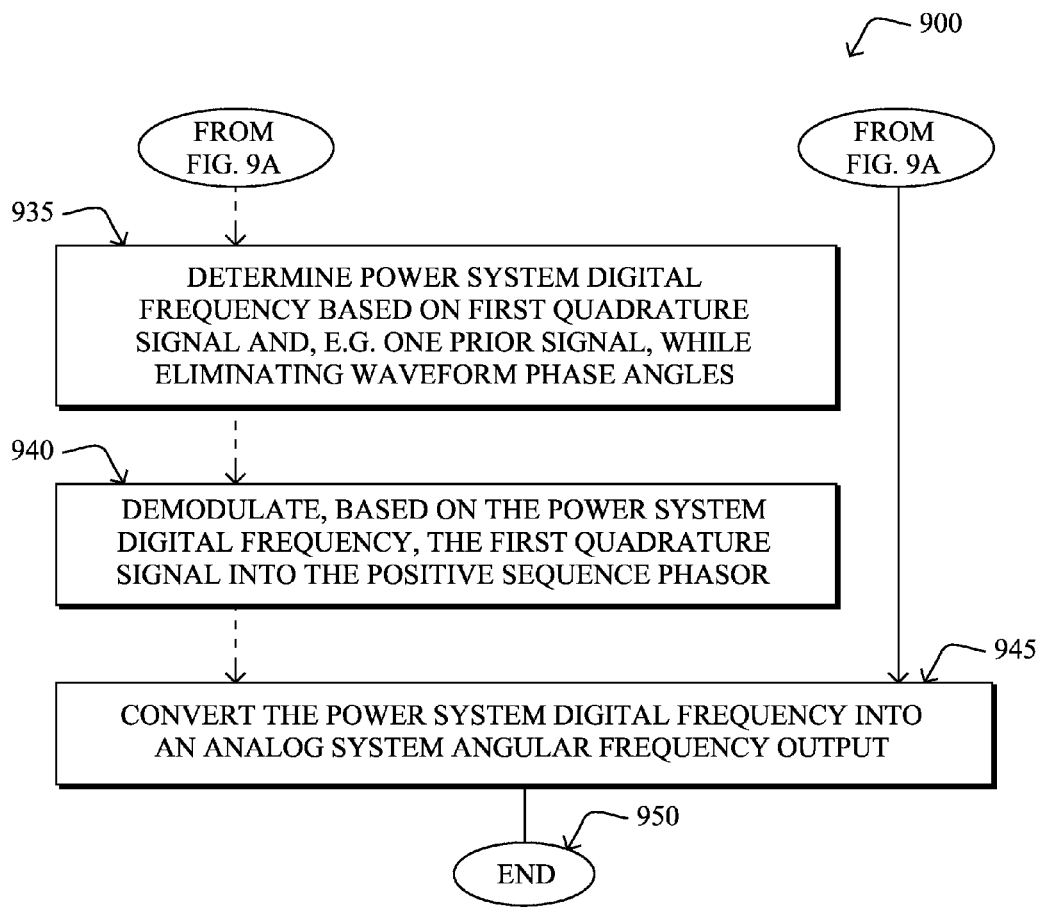

FIGS. 9A-9B illustrate an example simplified and generic procedure for instantaneous phasor determination in a polyphase electric system in accordance with one or more embodiments described above, from the perspective of a computing/measuring device 200 and/or 500 (or some combination thereof). The procedure 900 starts at step 905, and continues to step 910, where, as described in greater detail above, three substantially simultaneous phase waveforms 510 are converted into a first quadrature signal and a zero sequence signal (e.g., by Clarke transformer 520).

If the zero sequence signal indicates that the signal is unbalanced in step 915, then (according to FIG. 6 or FIG. 8) the procedure continues (along the solid line) to step 920 to determine the power system digital frequency for each phase waveform through analysis of a sequence of the first quadrature signal and two or more prior quadrature signals while eliminating waveform phase angles. Accordingly, in step 925, the process (e.g., demodulator 550) demodulates, based on the power system digital frequency, the first quadrature signal and zero sequence signal into positive, negative, and zero sequence phasors 570. For example, as described above, step 925 may correspondingly upshift, downshift, remove double frequencies by applying notch filters 560 (e.g., complex notches, adaptive notches), etc. Also, optionally, in step 930 the procedure 900 may convert the symmetrical components of the positive, negative, and zero sequence phasors into an unbalanced phasor set 590 (e.g., via an inverse Fortescue transformer 580).

Returning to step 915, in the event the zero sequence signal indicates that the signal is balanced, then (according to FIG. 7) the procedure continues (along the dashed line) to step 935 to determine the power system digital frequency for each phase waveform through analysis of a sequence of the first quadrature signal and a single prior quadrature signal, while eliminating waveform phase angles. Then, in step 940, the demodulator 550, based still on the power system digital frequency, demodulates the first quadrature signal into the positive sequence phasor (again, the negative sequence phasor and zero sequence phasor are zero).

Note that as an option to both balanced and unbalanced waveforms, the procedure 900 may convert the power system digital frequency into an analog system angular frequency output in step 945. The procedure illustratively ends in step 950, though may continue to update phasor values based on additional samples, accordingly. It should be noted that while certain steps within procedure 900 may be optional as described above, the steps shown in FIGS. 9A-9B are merely examples for illustration, and certain other steps may be included or excluded as desired. Further, while a particular order of the steps is shown, this ordering is merely illustrative, and any suitable arrangement of the steps may be utilized without departing from the scope of the embodiments herein. Moreover, while the procedure 900 is described as a single procedure, certain steps from the procedure may be incorporated into other procedures, and the procedure shown is not meant to be all-inclusive.

The novel techniques described herein, therefore, provide for instantaneous phasor determination in a poly-phase electric system. In particular, the novel techniques convert digitized three-phase AC voltage or current signals representing unbalanced phasors into full symmetric component phasors on a per waveform sample basis (e.g., an output on every waveform sample without phase lag), while taking into account instantaneous three-phase power frequency. Specifically, the techniques herein have the characteristic of calculating the phasors without the use of high order filters (especially long non-recursive filters), feedback loops, phase-locked loops, or iterative processing techniques, and avoid any need to buffer any more than the immediate set of waveform samples, so no storage of past waveform samples is needed. Moreover, the process does not require any post-computation correction for frequency errors, and has a significant simplification in the case where the waveforms are in fact balanced, providing a fast method for determining if the balance exists before calculating what would turn out to be unnecessary negative and zero sequence phasor coefficients.

Furthermore, the techniques according to one or more embodiments above have the additional benefit of comprising a lightweight set of computations as compared to standard phasor calculation methods, so that implementation in devices such as field area routers (FARs) and connected grid routers (CGRs) or other embedded processors is efficient and compact from code size, code execution, and data storage standpoints. That is, the techniques herein may be used with smart grid technologies as part of an integrated smart sensor strategy, for example, allowing each substation and field router to act as a smart sensor, thus eliminating the need for external smart sensor remote terminal units (RTUs). For instance, waveform transducers may be connected via analog-to-digital conversion cards to a router, and the techniques herein may thus be implemented in the router itself. Electric utilities could thus use the techniques herein to increase grid observability, and the synchrophasor components described herein could be communicated to grid analytics and control applications that might reside locally, at a substation, or at a control center. Illustratively, for example, FARs and/or CGRs with this capability may be used on distribution circuits and at Points of Common Coupling for microgrids and Distributed Energy Resources to obtain key grid state information at any location where such devices are deployed.

While there have been shown and described illustrative embodiments that provide for instantaneous phasor determination in a poly-phase electric system, it is to be understood that various other adaptations and modifications may be made within the spirit and scope of the embodiments herein. For example, while the embodiments above generally describe the poly-phase source system as a three-phase system, this is merely one example embodiment of a poly-phase system (granted, the most prevalent type today), and is not meant to limit the embodiments herein. Also, the embodiments have been shown and described herein with relation to particular computational components, such as Clarke transformers, inverse Fortescue transformers, notch filters, etc., and more particularly, to certain implementations (formulas, constants, multipliers, etc.) However, the embodiments in their broader sense are not as limited, and may, in fact, be used with other types of suitable computation components and/or implementations. In addition, as noted above, while the techniques above may have made specific reference to transmission systems or distribution systems, the disclosure herein applies to both the transmission and distribution portions of the electric grid, where applicable.

The foregoing description has been directed to specific embodiments. It will be apparent, however, that other variations and modifications may be made to the described embodiments, with the attainment of some or all of their advantages. For instance, it is expressly contemplated that the components and/or elements described herein can be implemented as software being stored on a tangible (non-transitory) computer-readable medium (e.g., disks/CDs/etc.) having program instructions executing on a computer, hardware, firmware, or a combination thereof. Accordingly this description is to be taken only by way of example and not to otherwise limit the scope of the embodiments herein. Therefore, it is the object of the appended claims to cover all such variations and modifications as come within the true spirit and scope of the embodiments herein.

What is claimed is:

1. A computer-implemented method, comprising:
converting three substantially simultaneous phase waveforms into a first quadrature signal and a zero sequence signal;
determining a power system digital frequency for each phase waveform through analysis of the first quadrature signal while eliminating waveform phase angles from the analysis; and
demodulating, based on the power system digital frequency, the first quadrature signal and zero sequence signal into a positive sequence phasor, a negative sequence phasor, and a zero sequence phasor.

2. The method as in claim 1, further comprising:
converting symmetrical components of the positive sequence phasor, negative sequence phasor, and zero sequence phasor into an unbalanced phasor set.

3. The method as in claim 1, wherein determining the power system digital frequency is through analysis of the sequence of the first quadrature signal and two additional prior quadrature signals.

4. The method as in claim 1, further comprising:
converting the power system digital frequency into an analog system angular frequency output.

5. The method as in claim 1, wherein demodulating comprises:
obtaining the positive sequence phasor by i) upshifting the first quadrature signal to move a negative sequence modulation frequency to zero and ii) removing a first double frequency component resulting from the upshifting to obtain the positive sequence phasor; and
obtaining the negative sequence phasor by i) downshifting the first quadrature signal to move a positive sequence modulation frequency to zero and ii) removing a second double frequency component resulting from the downshifting to obtain the negative sequence phasor.

6. The method as in claim 5, wherein demodulating further comprises:
obtaining the zero sequence phasor through a single demodulation that uses one of either a positive frequency or a negative frequency of the zero sequence signal.

7. The method as in claim 5, wherein removing the first and second double frequency components comprises:
utilizing a plurality of notch filters to remove the first and second double frequency components.

8. The method as in claim 7, wherein the plurality of notch filters are synthesized based on recursive feedback stabilization to provide sharply defined second order filtering.

9. The method as in claim 7, further comprising:
adapting one or more filter coefficients of the plurality of notch filters in response to a frequency deviation greater than a threshold between the power system digital frequency for the first quadrature signal and the at least one additional prior quadrature signal.

10. The method as in claim 1, further comprising:
determining that the three substantially simultaneous phase waveforms are balanced; and
wherein demodulating comprises, in response to determining that the three substantially simultaneous phase waveforms are balanced, demodulating, based on the power system digital frequency, the first quadrature signal into the positive sequence phasor only, wherein the negative sequence phasor and zero sequence phasor are exactly zero.

11. The method as in claim 10, wherein determining that the three substantially simultaneous phase waveforms are balanced comprises determining the balance based on the zero sequence signal prior to determining the power system digital frequency and demodulating.

12. The method as in claim 1, wherein determining the power system digital frequency is through analysis of the sequence of the first quadrature signal and at least one prior quadrature signal.

13. The method as in claim 1, further comprising:
utilizing a first complex coefficient notch filter between an output of the transformer and an input of the demodulator for the positive sequence phasor;
utilizing a second complex coefficient notch filter between the output of the transformer and an input of the demodulator for the zero sequence phasor; and
utilizing a complex subtractor between the output of the transformer and an input of the demodulator for the negative sequence phasor to subtract an output of the first complex coefficient notch filter from the output of the transformer for the input of the demodulator for the negative sequence phasor.

14. The method as in claim 1, wherein the positive sequence phasor, negative sequence phasor, and zero sequence phasor are synchrophasors.

15. An apparatus, comprising:
a Clarke transformer to convert three substantially simultaneous phase waveforms into a first quadrature signal and a zero sequence signal;
an instantaneous frequency evaluator to determine a power system digital frequency for each phase waveform through analysis of the first quadrature signal while eliminating waveform phase angles from the analysis; and
a complex frequency-adaptive synchrodyne demodulator to demodulate, based on the power system digital frequency, the first quadrature signal and zero sequence signal into a positive sequence phasor, a negative sequence phasor, and a zero sequence phasor.

16. The apparatus as in claim 15, further comprising:
an inverse Fortescue transformer to convert symmetrical components of the positive sequence phasor, negative sequence phasor, and zero sequence phasor into an unbalanced phasor set.

17. The apparatus as in claim 15, wherein the demodulator comprises:
a first portion to obtain the positive sequence phasor by i) an upshift of the first quadrature signal to move a negative sequence modulation frequency to zero and ii) a removal of a first double frequency component resulting from the upshift to obtain the positive sequence phasor;
a second portion to obtain the negative sequence phasor by i) a downshift of the first quadrature signal to move a positive sequence modulation frequency to zero and ii) a removal a second double frequency component resulting from the downshifting to obtain the negative sequence phasor; and
a third portion to obtain the zero sequence phasor through a single demodulation that uses one of either a positive frequency or a negative frequency of the zero sequence signal.

18. The apparatus as in claim 17, further comprising:
a plurality of notch filters to remove the first and second double frequency components.

19. The apparatus as in claim 15, wherein the demodulator is further configured to, in response to a determination that the three substantially simultaneous phase waveforms are balanced:

demodulate, based on the power system digital frequency, the first quadrature signal into the positive sequence phasor only, wherein the negative sequence phasor and the zero sequence phasor are exactly zero.

20. The apparatus as in claim 15, wherein determining the power system digital frequency is through analysis of the sequence of the first quadrature signal and at least one prior quadrature signal.

21. The apparatus as in claim 15, further comprising:
a first complex coefficient notch filter between an output of the transformer and an input of the demodulator for the positive sequence phasor;
a second complex coefficient notch filter between the output of the transformer and an input of the demodulator for the zero sequence phasor; and
a complex subtractor between the output of the transformer and an input of the demodulator for the negative sequence phasor to subtract an output of the first complex coefficient notch filter from the output of the transformer for the input of the demodulator for the negative sequence phasor.

22. A tangible, non-transitory, computer-readable media having software encoded thereon, the software, when executed by a processor, operable to:
convert three substantially simultaneous phase waveforms into a first quadrature signal and a zero sequence signal;
determine a power system digital frequency for each phase waveform through analysis of the first quadrature signal while eliminating waveform phase angles from the analysis; and
demodulate, based on the power system digital frequency, the first quadrature signal and zero sequence signal into a positive sequence phasor, a negative sequence phasor, and a zero sequence phasor.

23. The computer-readable media as in claim 22, wherein the software when executed is further operable to:
convert symmetrical components of the positive sequence phasor, negative sequence phasor, and zero sequence phasor into an unbalanced phasor set.

24. The computer-readable media as in claim 21, wherein the software when executed is further operable to:
determine that the three substantially simultaneous phase waveforms are balanced based on the zero sequence signal prior to determining the power system digital frequency and demodulating; and in response:
demodulate, based on the power system digital frequency, the first quadrature signal into the positive sequence phasor only, wherein the negative sequence phasor and the zero sequence phasor are exactly zero.

25. The computer-readable media as in claim 21, wherein the software when executed is further operable to:
implement a first complex coefficient notch filter between an output of the transformer and an input of the demodulator for the positive sequence phasor;
implement a second complex coefficient notch filter between the output of the transformer and an input of the demodulator for the zero sequence phasor; and
implement a complex subtractor between the output of the transformer and an input of the demodulator for the negative sequence phasor to subtract an output of the first complex coefficient notch filter from the output of the transformer for the input of the demodulator for the negative sequence phasor.

\* \* \* \* \*